(12) United States Patent
Schelling et al.

(10) Patent No.: US 9,788,124 B2
(45) Date of Patent: Oct. 10, 2017

(54) COMPONENT HAVING A MICROMECHANICAL MICROPHONE PATTERN

(71) Applicant: Robert Bosch GmbH, Stuttgart (DE)

(72) Inventors: Christoph Schelling, Stuttgart (DE); Stefan Singer, Reutlingen (DE); Jochen Zoellin, Muelheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/244,347

(22) Filed: Aug. 23, 2016

(65) Prior Publication Data

US 2016/0353209 A1    Dec. 1, 2016

Related U.S. Application Data

(62) Division of application No. 14/257,558, filed on Apr. 21, 2014, now Pat. No. 9,451,366.

(30) Foreign Application Priority Data

Apr. 25, 2013 (DE) .................. 10 2013 207 497

(51) Int. Cl.
| | |
|---|---|
| *H01L 29/84* | (2006.01) |
| *H04R 19/00* | (2006.01) |
| *H04R 19/04* | (2006.01) |
| *B81B 7/00* | (2006.01) |

(52) U.S. Cl.
CPC ......... *H04R 19/005* (2013.01); *B81B 7/0041* (2013.01); *H01L 29/84* (2013.01); *H04R 19/04* (2013.01); *B81B 2201/0257* (2013.01); *H04R 2201/003* (2013.01)

(58) Field of Classification Search
CPC ........ H04R 19/04; H04R 19/005; H01L 29/84
See application file for complete search history.

(56) References Cited

U.S. PATENT DOCUMENTS

| 6,075,867 A | 6/2000 | Bay |
| 6,111,966 A | 8/2000 | Staat |
| 9,451,366 B2 * | 9/2016 | Schelling ............... H04R 19/04 |

(Continued)

*Primary Examiner* — Michele Fan
(74) *Attorney, Agent, or Firm* — Norton Rose Fulbright US LLP; Gerard Messina

(57) ABSTRACT

Measures are provided for increasing the resistance to compression of a component having a micromechanical microphone pattern. In particular, the robustness of the microphone pattern to highly dynamic pressure fluctuations is to be increased, without the microphone sensitivity, i.e. the microphone performance, being impaired. The microphone pattern of such a component is implemented in a layer construction on a semiconductor substrate and includes at least one acoustically active diaphragm, which spans a sound hole on the substrate backside, and a stationary acoustically penetrable counterelement having through hole openings, which is situated above/below the diaphragm in the layer construction. At least one outflow channel is developed which makes possible a rapid pressure equalization between the two sides of the diaphragm. In addition, at least one controllable closing element is provided, with which the at least one outflow channel is optionally able to be opened or closed.

13 Claims, 9 Drawing Sheets

(56) References Cited

U.S. PATENT DOCUMENTS

| | | | |
|---|---|---|---|
| 2003/0133588 A1* | 7/2003 | Pedersen | B81B 3/0072 |
| | | | 381/423 |
| 2007/0201709 A1* | 8/2007 | Suzuki | B81B 3/0072 |
| | | | 381/174 |
| 2008/0104825 A1 | 5/2008 | Dehe | |
| 2008/0310663 A1 | 12/2008 | Shirasaka | |
| 2009/0169035 A1 | 7/2009 | Rombach | |
| 2013/0223023 A1 | 8/2013 | Dehe | |
| 2013/0223654 A1 | 8/2013 | Dehe | |
| 2013/0243234 A1 | 9/2013 | Zoellin | |
| 2014/0084396 A1 | 3/2014 | Jenkins | |
| 2014/0169585 A1 | 6/2014 | Howes | |
| 2015/0014796 A1 | 1/2015 | Dehe | |

\* cited by examiner

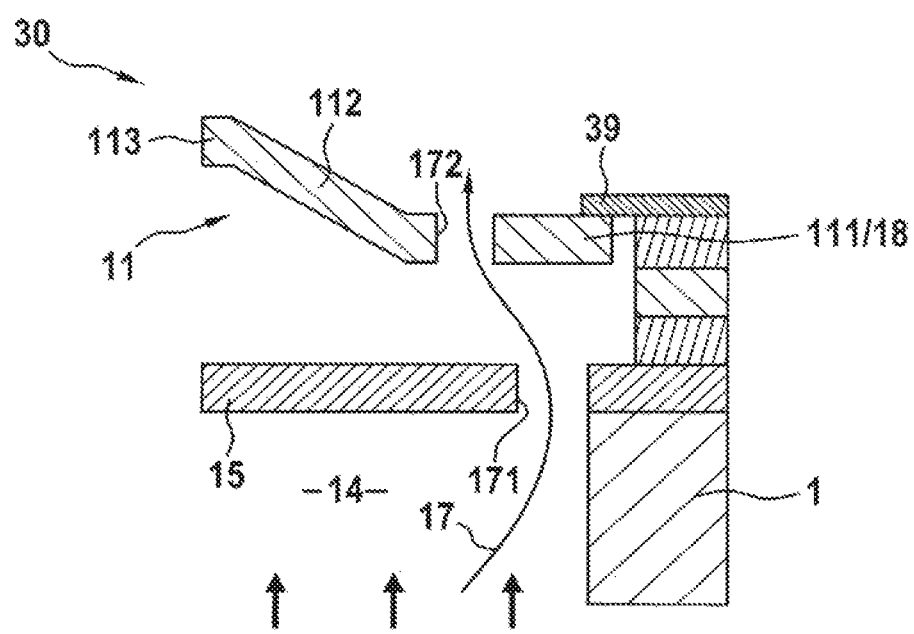

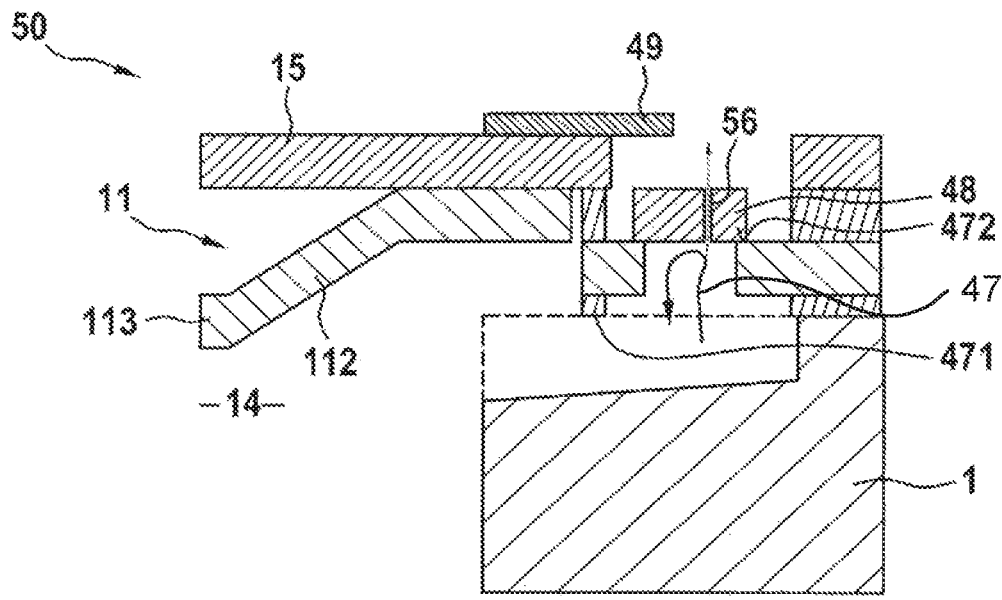
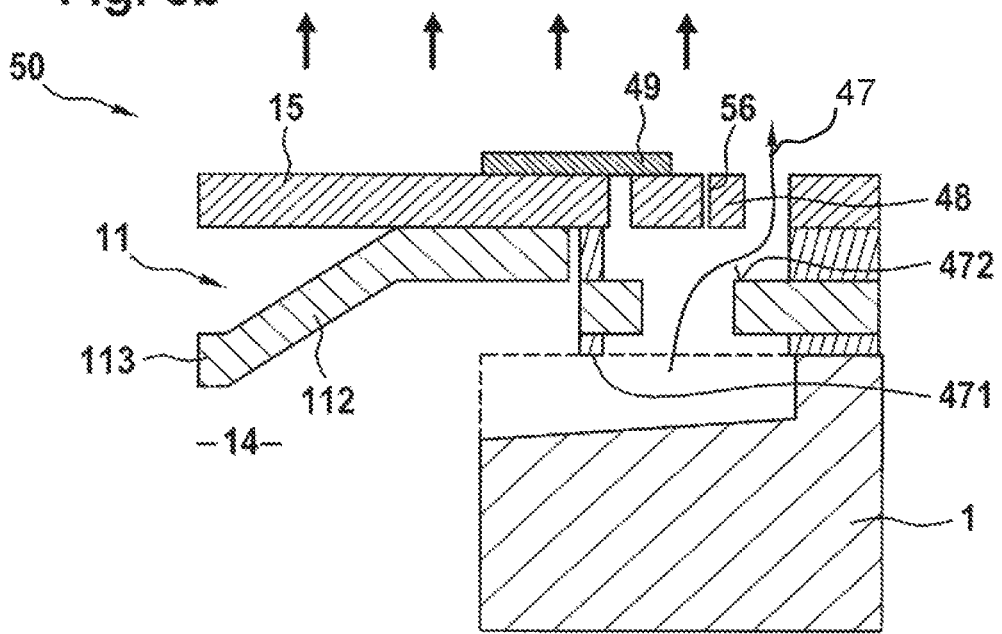

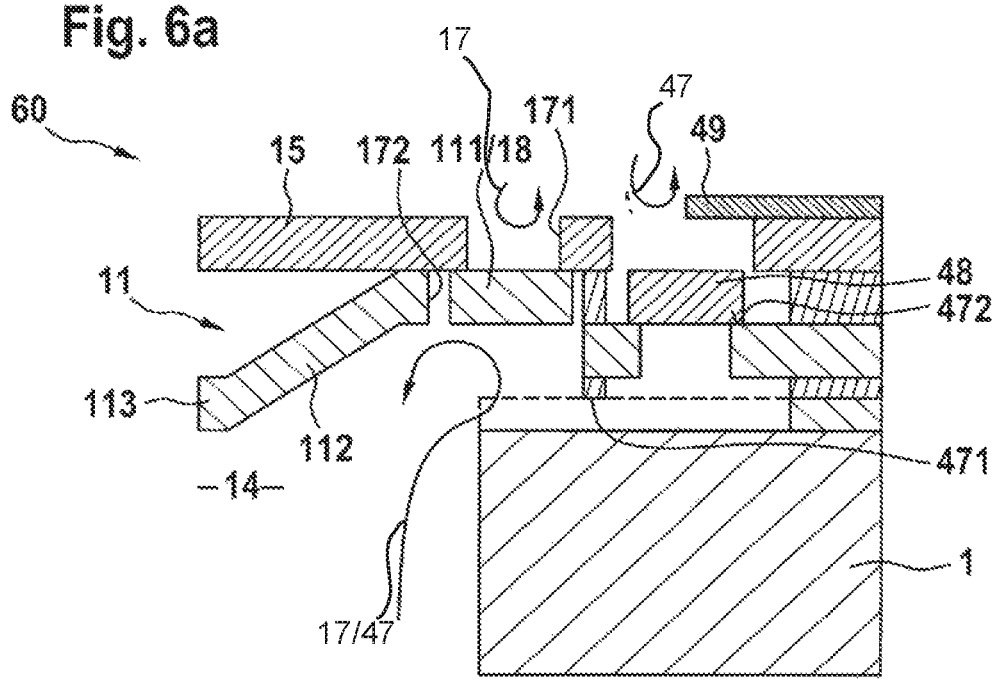
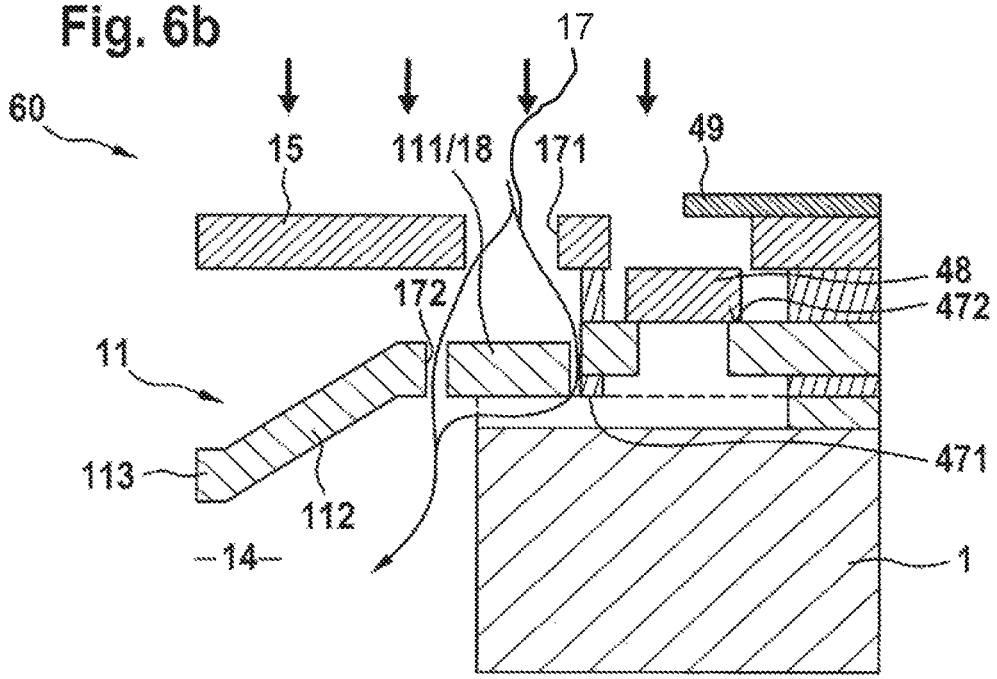

COMPONENT HAVING A MICROMECHANICAL MICROPHONE PATTERN

CROSS-REFERENCE TO RELATED APPLICATION

The present application is a divisional application of U.S. patent application Ser. No. 14/257,558 filed Apr. 21, 2014, which claims priority to and the benefit of German Pat. App. No. 10 2013 207 497.2 filed Apr. 25, 2013, the disclosures of each of which are incorporated herein by reference in their entireties.

FIELD OF THE INVENTION

The present invention relates to a component having at micromechanical microphone pattern, which is implemented in a layer construction on a semiconductor substrate. The microphone pattern includes an acoustically active diaphragm, which spans a sound hole on the backside of the substrate, and a stationary acoustically penetrable counterelement, having through hole openings, which is situated in the layer construction above or below the diaphragm.

BACKGROUND

The diaphragm's being acted upon by sound takes place via the sound hole in the substrate and/or via the through holes in the counterelement. The diaphragm deflections resulting from this, perpendicular to the layer planes, are able to be detected capacitively, for example. For this, the microphone pattern is equipped with a capacitor device which includes at least one deflectable electrode on the diaphragm and at least one stationary electrode on the counterelement. The volume directly in front of and behind the acoustically active diaphragm of the component under discussion should be as airtight as possible, in order to avoid an acoustical short circuit and to achieve a good microphone sensitivity.

The higher the pressure difference between the two sides of the diaphragm, the greater is the diaphragm deflection and, with that, also the mechanical stress of the diaphragm. The microphone diaphragm of the component being discussed is not normally designed for highly dynamic pressure fluctuations and high pressure differences. Such overload situations, which may even lead to damage in the microphone pattern, may not, however, be totally excluded either during the production process nor at the point of use of the component. Thus, during the production process, in "pick'n place" assembly, very high suction pressures are used, and also at the place of use of the component, strong air blasts may occur, such as are caused by an air pistol, for example.

SUMMARY

The present invention provides measures for increasing the resistance to compression of a component named at the outset. In particular, the robustness of the microphone pattern to highly dynamic pressure fluctuations is to be increased, without the microphone sensitivity, i.e. the microphone performance, being impaired.

For this purpose, according to the present invention, at least one outflow channel is developed in the layer construction, which makes possible a rapid pressure equalization between the two sides of the diaphragm. Furthermore, according to the present invention, at least one controllable encrypting element is provided, with which the at least one outflow channel may optionally be opened or closed.

In normal operation, the active mode of the component, the outflow channel is to be held closed, in order not to impair the microphone sensitivity. Only when highly dynamic pressure fluctuations as of a specified magnitude occur, should the outflow channel be opened, so that the force of the corresponding pressure wave is conducted past the diaphragm or is weakened to such an extent that it does not lead to damage of the diaphragm. The closing element may simply be actuated as a function of the different operating modes of the component. In this case, the actuation of the closing element for closing the outflow channel may be connected to the actuation of the diaphragm. In the overload case, the outflow channel is opened automatically in the simplest case, i.e. by the acting pressure force or suction force. However, in the overload case, the closing element may also be actively actuated, for example, if the pressure conditions in the surroundings are monitored with the aid of a threshold value switch especially provided for this.

Basically there are different possibilities for implementing an outflow channel according to the present invention, having a controllable closing element. The construction of the microphone pattern has to be taken into account in this context. But the type of the overload situation that is to be avoided is also important, that is, whether an impact force or a suction force is to be reduced. As an impact force or an impact pressure, a force is designated in the following which presses the diaphragm away from the counterelement, while as a suction force a force is designated which presses or draws the diaphragm against the counterelement. The direction of the acting force must particularly be taken into account in the design of the closing element, since, in the case of an overload situation, the closing element should preferably be moved with, and not against the acting force, in order to open the outflow channel.

To compensate for impact pressure overload situations, the outflow channel may advantageously be implemented in the diaphragm range of the microphone pattern. In one preferred specific embodiment of the component according to the present invention, the outflow channel is developed at the edge of the diaphragm area, namely, in the form of a first pressure equalization opening in the edge region of the counterelement and of a second pressure equalizationopening in the edge region of the diaphragm. The two pressure equalization openings communicate with each other by forming a flow connection between the two sides of the diaphragm, depending on the diaphragm position. Since the two pressure equalization openings are situated offset to each other, the diaphragm itself may be used as a controllable closing element. For this purpose, the diaphragm, in the active mode of the component, is drawn against the counterelement, the edge region of the counterelement functioning as a seat for the diaphragm edge. In this diaphragm position, both pressure equalization openings are closed. In response to the occurrence of an impact pressure, which presses the diaphragm away from the counterelement, the pressure equalization openings are automatically opened by the diaphragm motion, and thus make possible a rapid pressure equalization between the two sides of the diaphragm. In the layer construction at least one stop is advantageously developed for the diaphragm, which limits the diaphragm deflection during the opening of the outflow channel, and thus protects against damage from an overload.

In one particularly versatile usable refinement of this specific embodiment of the present invention, the diaphragm is not only able to be moved actively in the direction of the counterelement, in order to close the outflow channel, but also to be moved actively away from the the counterelement, in orderly actively to open the outflow channel. This may be meaningful if the microphone function is not needed and/or highly dynamic pressure fluctuations are to be expected at clearly defined time periods. The actuation of the diaphragm preferably takes place electrostatically. In this case, the diaphragm is respectively pulled against a corresponding stop in the layer construction, which defines the closed position and the open position.

In one particularly advantageous specific embodiment of the component according to the present invention, which is able to be designed both for the case of an impact pressure-overload situation and also for the case of a suction pressure-overload situation, at least one outflow channel is developed laterally next to the diaphragm area and is connected to the backside of the diaphragm via a lateral access opening. The associated closing element is developed in at least one layer of the layer construction, in this case, so that it is movable perpendicular to the layer planes within the outflow channel. In this specific embodiment, the closing element is structurally independent of the diaphragm, and is also moved independently of it, in order to open or close the outflow channel.

The closed position of the closing element is preferably defined by a bottleneck in the outflow channel, which functions as an encircling stop or seat for the closing element, so that the outflow channel is closed as pressure-tightly as possible. It is important that the closing element be situated above this bottleneck, in the direction of the force occurring in the overload case, so that it is pressed out of its closed position by this force or together with this force, and the outflow channel is opened. Depending on the situation of the closing element with respect to the bottleneck in the outflow channel, the latter may thus be designed to dissipate a suction force or even an impact force. In each case it proves to be advantageous, even in this specific embodiment of the present invention, if, in the layer construction, at least one stop is developed which limits the deflection of the closing element in response to the opening of the outflow channel.

At this point, we should explicitly point out that a component, of the type under discussion, with the aid of the measures according to the present invention, is able to be designed both for impact force overload situations and for suction force overload situations. The component is advantageously equipped for this purpose with separate outflow channels and corresponding closing elements.

BRIEF DESCRIPTION OF THE DRAWINGS

FIGS. 3a-3c show schematic sectional representations through the edge region of the microphone pattern of a third component 30 according to the present invention, in the passive operating mode (FIG. 3a) and the active operating mode (FIG. 3b) as well as in the case of an impact pressure overload situation (FIG. 3c).

FIGS. 5a, 5b show schematic sectional representations through the edge region of the microphone pattern of a fifth component 50 according to the present invention, in the active operating mode (FIG. 5a) and in the case of a suction pressure overload situation (FIG. 5b).

FIGS. 6a-6c show schematic sectional representations through the edge region of the microphone pattern of a sixth component 60 according to the present invention, in the active operating mode (FIG. 6a) in the case of an impact pressure overload situation (FIG. 6b) and in the case of a suction force overload situation (FIG. 6c).

DETAILED DESCRIPTION

Figure 1A:
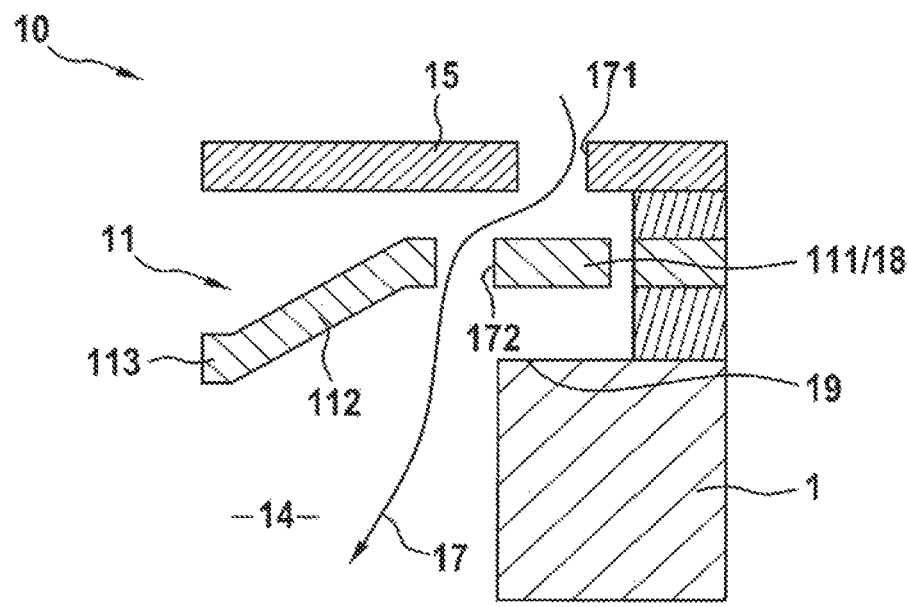
FIGS. 1a-1c show schematic sectional representations through the edge region of the microphone pattern of a first component 10 according to the present invention, in the passive operating mode (FIG. 1a) and the active operating mode (FIG. 1b) as well as in the case of an impact pressure overload situation (FIG. 1c).

The microphone patterns of components 10, 20 and 30 are each implemented in a layer construction on a semiconductor substrate 1. They include an acoustically active diaphragm 11 which spans a sound hole 14 on the backside of the substrate. Moreover, the microphone patterns include a stationary acoustically penetrable counterelement 15 which, in the case of components 10 and 20, is situated in the layer construction above diaphragm 11, and in the case of component 30, in the layer construction below diaphragm 11. In particular, the sectional representations of FIGS. 1a and 3a, the microphone patterns of components 10 and 30 in the passive operating mode show, illustrate that diaphragm 11 is in each case made up of an edge region 111, a parallel-sided middle region 113 and a transitional region 112 between edge region 111 and middle region 113, and that, between edge region 111 of diaphragm 11 and counterelement 15 there is a shorter distance than between parallel-sided middle region 113 of diaphragm 11 and counterelement 15. In counterelement 15, through hole openings are developed which are not shown here, however, since they are located over middle region 113 of diaphragm 11. The signal detection takes place capacitively in each case with the aid of a capacitor device which includes at least one deflectable electrode on diaphragm 11 and at least one stationary electrode on counterelement 15.

According to the present invention, in the layer construction of microphone components 10, 20 and 30, in each case at least one outflow channel 17 is developed, which enables a rapid pressure equalization between the two sides of diaphragm 11. For each outflow channel 17, at least one controllable closing element 18 is provided, with which outflow channel 17 may optionally be opened or closed.

In the case of all three microphone components 10, 20 and 30, outflow channel 17 is designed with closing element 18 to reduce an overload situation, in which diaphragm 11 is pushed away by counterelement 15, which is designated as impact force overload situations.

Outflow channel 17 is in this instance, in each case, implemented in the form of a first pressure equalization opening 171 in the edge region of counterelement 15, and a second pressure equalization opening 172 in the edge region of diaphragm 11. These two pressure equalization openings 171 and 172 are situated in an offset manner to each other, so that, depending on the position of diaphragm 11, they are closed or communicate with each other, that is, they make possible an air flow between the front side of the component and sound hole 14 and thus they make possible a pressure equalization between the two sides of diaphragm 11.

Thus, accordingly, in all three cases diaphragm 11 itself, or rather edge region 111 of diaphragm 11, functions as controllable closing element 18, in that the two pressure equalization openings 171 and 172 are closed when edge region 111 of diaphragm 11 is draw against counterelement 15.

FIGS. 1a through 1c, 2a, 2b and 3a through 3c illustrate the method of functioning of outflow channel 17 as a function of the operating mode of the respective microphone component 10, 20 and 30 and the diaphragm position corresponding to the operating mode.

Figure 3A:
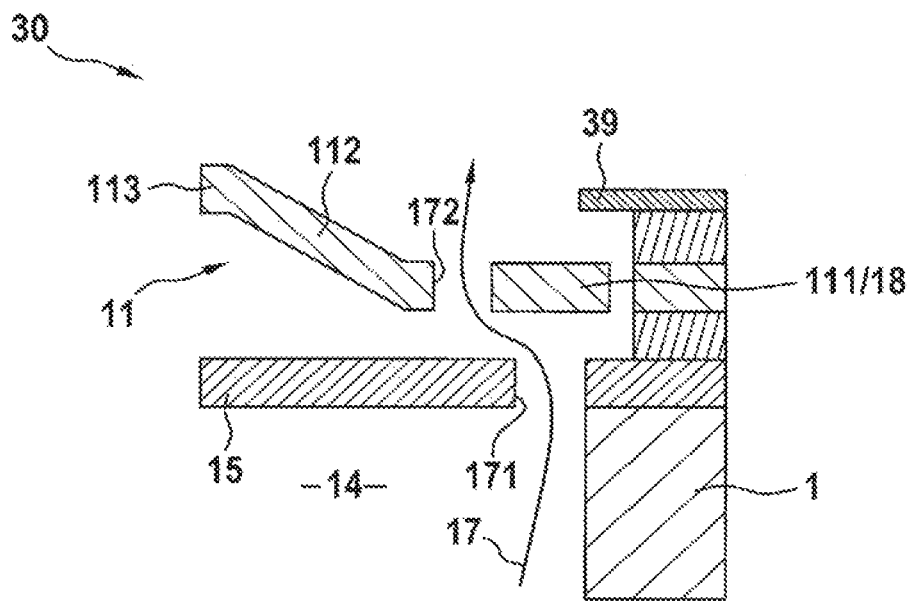

FIG. 1a and FIG. 3a show component 10 and component 30 in the so-called passive operating mode. The microphone function is not activated here. Accordingly, diaphragm 11 is in its at rest position, which comes about only based on the diaphragm pattern, the mechanical properties of the diaphragm and its integration into the layer construction. In this at rest position, edge region 111 of diaphragm 11 is at a distance from counterelement 15, so that a flow connection exists between the two pressure equalization openings 171 and 172. Outflow channel 17 is opened in this instance, so that the forces occurring in an impact pressure overload situation are reduced.

Figure 1B:
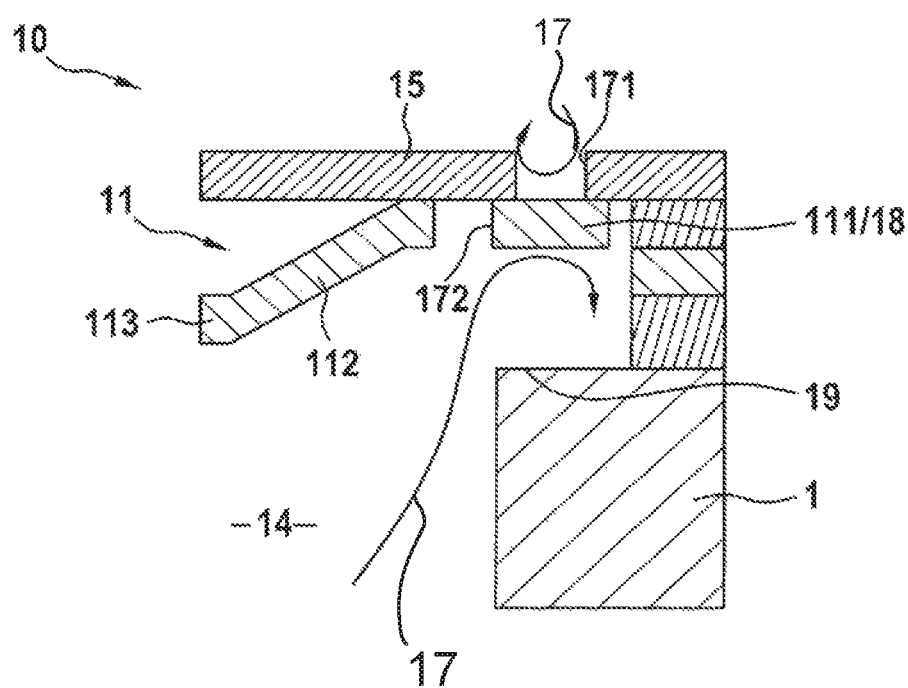
Figure 2A:
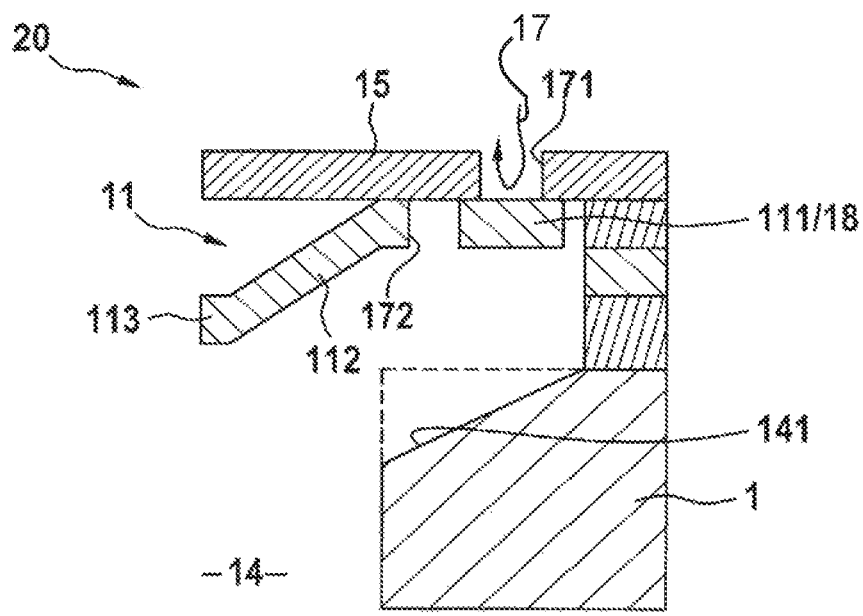
FIGS. 2a, 2b show schematic sectional representations through the edge region of the microphone pattern of a second component 20 according to the present invention, in the active operating mode (FIG. 2a) and in the case of an impact pressure overload situation (FIG. 2b).
Figure 3B:
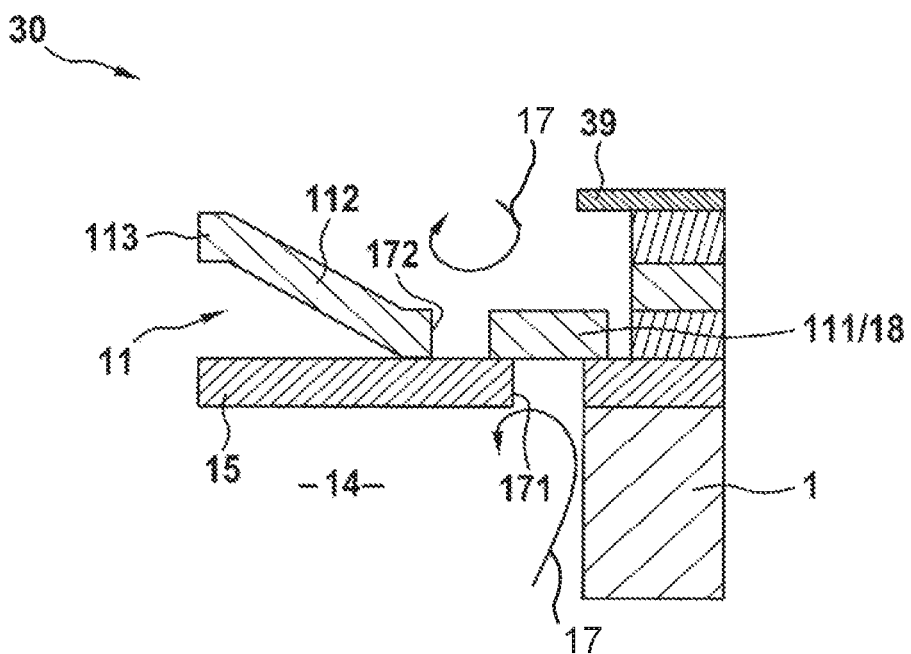

FIG. 1b, FIG. 2a and FIG. 3b show components 10, 20 and 30 in the active operating mode, i.e. having the actuated diaphragm 11. The actuation of diaphragm 11 for activating the microphone function may take place electrostatically, for example. In this context, diaphragm 11 is acted upon with a mechanical stress, in order to raise the microphone sensitivity. To do this, diaphragm 11 is drawn so far against counterelement 15 that edge region 111 of diaphragm 11 lies against counterelement 15. In this diaphragm position, both pressure equalization openings 171 and 172 are closed, whereby an acoustical short circuit via outflow channel 17 is avoided and maximum microphone sensitivity is achieved.

Figure 1C:
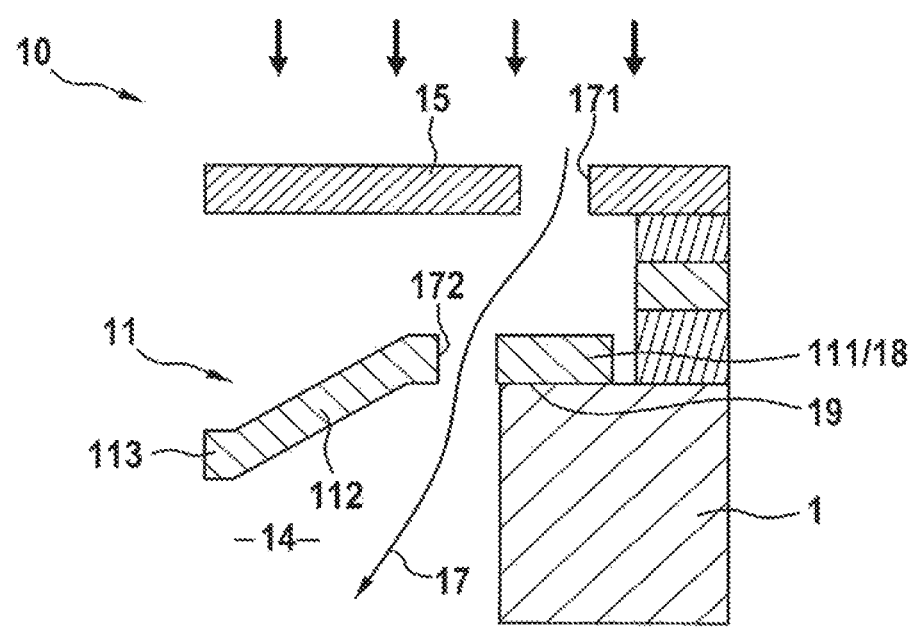
Figure 2B:
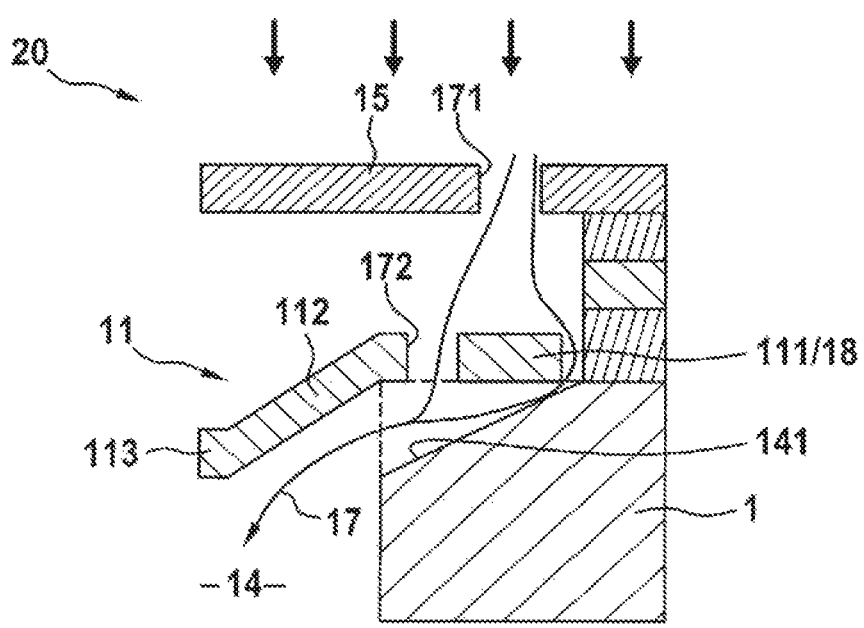

FIG. 1c, FIG. 2b and FIG. 3c show components 10, 20 and 30 in an impact pressure overload situations. In the case of components 10 and 20, the forces occurring in this case act upon the components' front side, while in component 30 they act upon the component's backside. In all three cases, diaphragm 11 is thereby pressed away from counterelement 15. In the process, pressure equalization openings 171 and 172 are also opened in edge region 111 of diaphragm 11 and of counterelement 15, so that a flow connection is created between the component front side and backside sound hole 14. This outflow channel 17 enables a rapid pressure equalization between the two sides of diaphragm 11, whereby the mechanical stress of the diaphragm is clearly weakened.

In the exemplary embodiment shown in FIGS. 1a through 1c, microphone component 10, substrate 1 in the edge region of sound hole 14 forms an encircling mechanical stop 19, which limits the diaphragm motion during the opening of outflow channel 17, and in this respect functions as overload protection for diaphragm 11 on the substrate side.

In the case of microphone component 20 shown in FIGS. 2a and 2b, the edge region of sound hole 14 is also used as a stop for the diaphragm motion. However, in this case, in the region of outflow channel 17 a recess 141 has been developed, through which the opening cross section of outflow channel 17 to sound hole 14 is enlarged.

In microphone component 30 shown in FIGS. 3a through 3c, in which diaphragm 11 is situated in the layer construction above counterelement 15, a mechanical stop 39 is developed in the layer construction above diaphragm 11, which limits the diaphragm motion during the opening of outflow channel 17, and thus forms an overload protection against impact pressure overload situations.

At this place, let us point out again that all the above-mentioned components 10, 20, 30 may also be equipped with means for actuating diaphragm 11, which enable an active opening of outflow channel 17. Because of that, the actuating of diaphragm 11 and the microphone function are able to be decoupled. This is particularly of advantage if the occurrence of impact pressure overload situations is detected even independently of the microphone pattern, such as with the aid of a dedicated sensor component.

The microphone pattern of capacitive microphone components 40 and 50 shown in FIGS. 4a, 4b and 5a, 5b is also implemented in a layer construction on a semiconductor substrate 1, and spans a sound hole 14 in the backside of the substrate. The microphone pattern includes an acoustically active diaphragm 11 having an edge region 111, a middle region 113 offset in a manner that is parallel-sided to it and a transitional region 112 between edge region 111 and middle region 113. In the layer construction above diaphragm 11, a stationary acoustically penetrable counterelement 15 is situated.

According to the present invention, in these components 40 and 50, there is also developed at least one outflow channel 47 in the layer construction, which enables a rapid pressure equalization between the two sides of diaphragm 11. For each outflow channel 47, at least one controllable closing element 48 is provided, with which outflow channel 47 may optionally be opened or closed.

In the case of microphone components 40 and 50 shown here, outflow channel 47 is designed with closing element 48 to reduce an overload situation, in which diaphragm 11 and particularly its middle region 113 is pulled against counterelement 15, which is designated as suction force overload situations.

In this case, outflow channel 47 is situated laterally beside the diaphragm area and extends through the layer construction up to substrate 1, where it is connected to the backside of diaphragm 11 via a lateral access opening 471. In one layer of the layer construction, a bottleneck 472 is developed in outflow channel 47. It functions as an encircling stop or seat for closing element 48, which in this instance is also patterned out from the layer construction, namely, from a layer above bottleneck 472. It is movable within outflow channel 47 perpendicular to the layer planes, in order to open or close outflow channel 47 in an optional manner.

FIGS. 4a, 4b and 5a, 5b illustrate the method of functioning outflow channel 47 as a function of the operating mode of the respective microphone component 40 or 50.

Figure 4A:
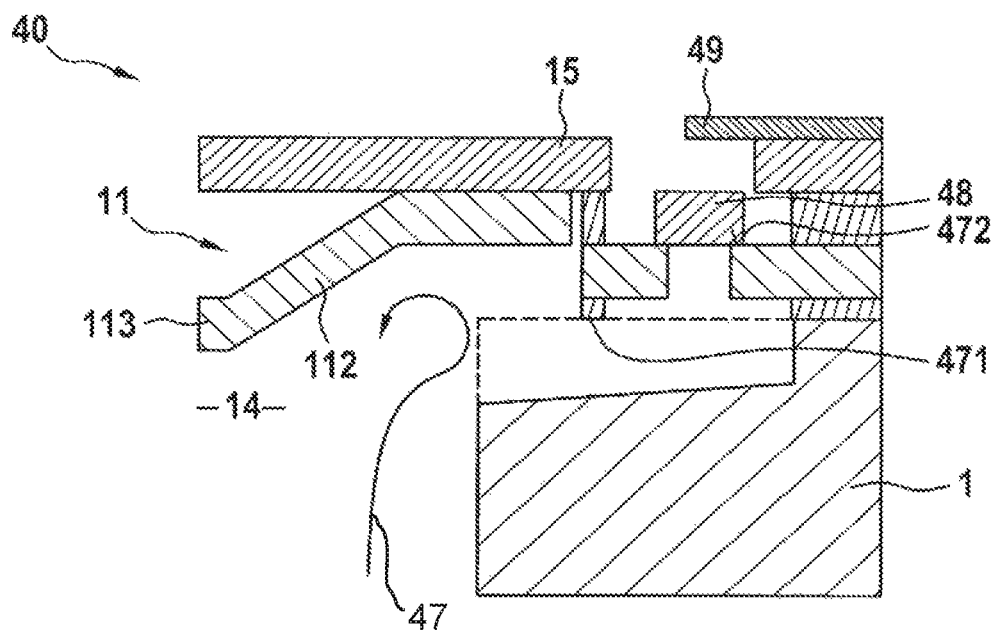
FIGS. 4a, 4b show schematic sectional representations through the edge region of the microphone pattern of a fourth component 40 according to the present invention, in the active operating mode (FIG. 4a) and in the case of a suction pressure overload situation (FIG. 4b).

FIG. 4a and FIG. 5a show components 40 and 50 in the active operating mode, in which diaphragm 11 has been drawn against counterelement 15, in order to act upon it with a mechanical stress. Outflow channel 47 is closed in order to avoid an acoustical short circuit and to achieve a maximum microphone sensitivity. For this purpose, closing element 48 was drawn against its seat 472 in outflow channel 47. The actuation of closing element 48 required for this may take place electrostatically, for example.

Figure 4B:
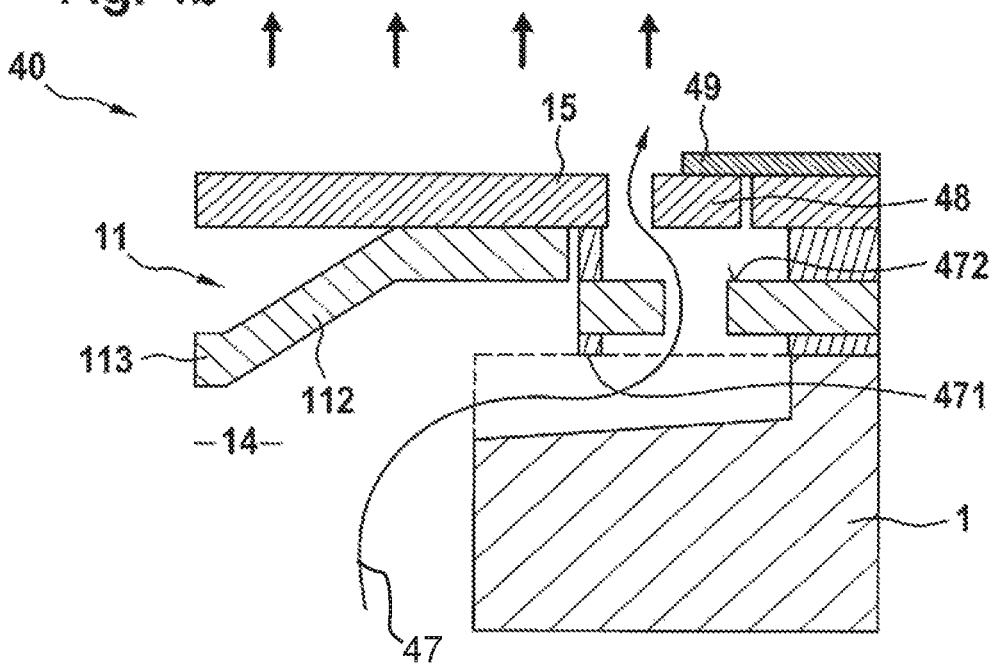

FIG. 4b and FIG. 5b show components 40 and 50 in a suction force overload situation. The forces occurring in this context, act upon the component front side, so that particularly middle region 113 of diaphragm 11 is drawn against counterelement 15. In this context, however, closing element 48 is also drawn upwards, i.e. in the direction towards the front side of the component, whereby outflow channel 47 is opened. By this flow connection between the front side of the component and the sound hole 14 on the backside, the mechanical stress of diaphragm 11 is clearly weakened.

In both exemplary embodiments, in the layer construction above outflow channel 47, a mechanical stop 49 is developed, which limits the motion of closing element 48 during the opening of outflow channel 47, and thus forms an overload protection in suction force overload situations.

Both microphone components 40 and 50 described above may also be equipped with means for actuating closing element 48, which enable an active opening of outflow channel 47.

Closing elements 48 of the components under discussion, in this case, may also be used for the design of the microphone damping behavior, by providing them with suitable ventilating openings 56, as in the case of microphone component 50.

Figure 6C:
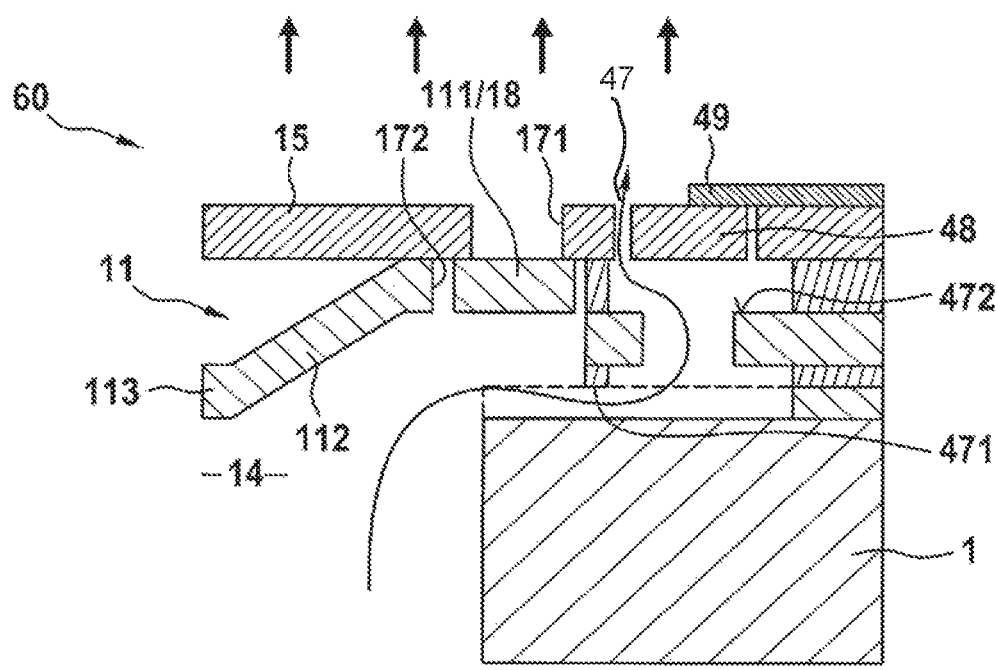

The microphone pattern of component 60 shown in FIGS. 6a through 6c includes both an outflow channel 17 in the diaphragm area, which is designed for impact pressure overload situations, and an outflow channel 47, having a closing element 48, which is designed for suction force overload situations. These components of the microphone pattern were described thoroughly in connection with FIGS. 1a through 1c and 4a, 4b. Therefore, we shall subsequently only explain the manner of functioning of outflow channels 17 and 47, with the aid of FIGS. 6a through 6c, as a function of the operating mode of microphone component 60.

FIG. 6a shows component 60 in the active operating mode, i.e. with an actuated diaphragm 11. Diaphragm 11 was drawn so far against counterelement 15 that edge region 111 of diaphragm 11 lies against counterelement 15. In this diaphragm position, both pressure equalization openings 171 and 172 are closed, whereby an acoustical short circuit via outflow channel 17 is avoided and maximum microphone sensitivity is achieved. Outflow channel 47 is also closed, so as to achieve maximum microphone sensitivity. For this purpose, closing element 48 was drawn against its seat 472 in outflow channel 47.

FIG. 6b shows component 60 in an impact pressure overload situation, that is, in which diaphragm 11 is pressed away from counterelement 15. In the process, pressure equalization openings 171 and 172 are also opened in edge region 111 of diaphragm 11 and of counterelement 15, so that a flow connection is created between the component front side and backside sound hole 14. This outflow channel 17 enables a rapid pressure equalization between the two sides of diaphragm 11, whereby the mechanical stress of the diaphragm is clearly weakened. The position of closing element 48 on bottleneck 472 in outflow channel 47 does not change, since closing element 48 is additionally pressed against seat 472 by the impact pressure stress.

FIG. 6c shows component 60 in a suction force overload situation, in which, in particular, middle region 113 of diaphragm 11 is drawn against counterelement 15. In this context, however, closing element 48 is also drawn upwards, i.e. in the direction towards the front side of the component, whereby outflow channel 47 is opened. By this flow connection between the front side of the component and the sound hole 14 on the backside, the mechanical stress of diaphragm 11 is clearly weakened. Pressure equalization openings 171 and 172 that are situated offset to each other remain closed, since diaphragm edge 111 is drawn against counterelement 15 in the case of a suction force acting upon the microphone pattern.

Microphone component 60 is proving itself both in impact pressure overload situations and in impact force overload situations as particularly stable to pressure, since the force of the respective pressure waves is guided past diaphragm 11, via outflow channels 17 and 47. The microphone sensitivity is not impaired thereby, since these outflow channels 17 and 47 are closed in the active operating mode of component 60.

What is claimed is:

1. A component, comprising:
  a semiconductor substrate;
  a micromechanical microphone pattern implemented in a layer construction on the substrate, the micromechanical pattern including at least:
    an acoustically active diaphragm spanning a sound hole on a backside of the substrate; and
    a stationary acoustically penetrable counterelement including through hole openings, wherein:
      the counterelement is situated in the layer construction at least one of above and below the diaphragm;
      at least one outflow channel is developed in the layer construction; and
      the at least one outflow channel enables a rapid pressure equalization between two sides of the diaphragm; and
  at least one controllable closing element for opening and closing the at least one outflow channel; wherein:
  the at least one outflow channel is arranged laterally next to a diaphragm area and is connected via a lateral access opening to a backside of the diaphragm;
  the closing element is arranged in at least one layer of the layer construction, so that the closing element is movable within the at least one outflow channel, perpendicularly to layer planes; and
  a bottleneck is arranged in a region of the at least one outflow, the bottleneck corresponding to one of an encircling stop and an encircling seat for the closing element in a closed position.

2. The component as recited in claim 1, wherein:
  at least one first pressure equalization opening in an edge region of the counterelement and at least one second pressure equalization opening, communicating with the at least one first pressure equalization opening, in an edge region of the diaphragm function as the at least one outflow channel;
  the first pressure equalization opening and the second pressure equalization opening are situated offset with respect to each other; and
  the diaphragm functions as the closing element in that the first pressure equalization opening and the second pressure equalization opening are closed when the edge region of the diaphragm is drawn against the counterelement.

3. The component as recited in claim 2, further comprising:
  at least one stop for the diaphragm arranged in the layer construction and for limiting a diaphragm motion during the opening of the at least one outflow channel.

4. The component as recited in claim 2, wherein the diaphragm is able to be actively moved away from the counterelement, whereby the at least one outflow channel is actively opened.

5. The component as recited in claim 1, further comprising:
  at least one stop for the closing element and arranged in the layer construction, the at least one stop limiting a motion of the closing element during the opening of the outflow channel.

6. The component as recited in claim 1, wherein the closing element is able to be moved actively into at least one of a closed position and an opened position.

7. The component as recited in claim 1, wherein:
the at least one outflow channel is provided with the closing element for compensating for a suction pressure overload situation, and
at least one second outflow channel is provided with a second closing element for compensating for an impact pressure overload situation.

8. A component, comprising:
a semiconductor substrate;
a micromechanical microphone pattern implemented in a layer construction on the substrate, the micromechanical pattern including at least:
an acoustically active diaphragm spanning a sound hole on a backside of the substrate; and
a stationary acoustically penetrable counterelement including through hole openings, wherein:
the counterelement is situated in the layer construction at least one of above and below the diaphragm;
at least one outflow channel is developed in the layer construction; and
the at least one outflow channel enables a rapid pressure equalization between two sides of the diaphragm; and
at least one controllable closing element for opening and closing the at least one outflow channel wherein:
the at least one outflow channel is provided with the closing element for compensating for an impact pressure overload situation, and
at least one second outflow channel is provided with a second closing element for compensating for a suction pressure overload situation.

9. The component as recited in claim 8, wherein:
at least one first pressure equalization opening in an edge region of the counterelement and at least one second pressure equalization opening, communicating with the at least one first pressure equalization opening, in an edge region of the diaphragm function as the at least one outflow channel;
the first pressure equalization opening and the second pressure equalization opening are situated offset with respect to each other; and
the diaphragm functions as the closing element in that the first pressure equalization opening and the second pressure equalization opening are closed when the edge region of the diaphragm is drawn against the counterelement.

10. The component as recited in claim 9, further comprising:
at least one stop for the diaphragm arranged in the layer construction and for limiting a diaphragm motion during the opening of the at least one outflow channel.

11. The component as recited in claim 9, wherein the diaphragm is able to be actively moved away from the counterelement, whereby the at least one outflow channel is actively opened.

12. The component as recited in claim 8, further comprising:
at least one stop for the closing element and arranged in the layer construction, the at least one stop limiting a motion of the closing element during the opening of the outflow channel.

13. The component as recited in claim 8, wherein the closing element is able to be moved actively into at least one of a closed position and an opened position.

* * * * *